United States Patent
Chen et al.

(10) Patent No.: US 11,529,797 B2
(45) Date of Patent: Dec. 20, 2022

(54) METHOD OF MANUFACTURING METAL-CLAD LAMINATE AND USES OF THE SAME

(71) Applicant: TAIWAN UNION TECHNOLOGY CORPORATION, Chupei (TW)

(72) Inventors: Wen-Ren Chen, Chupei (TW); Shur-Fen Liu, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 224 days.

(21) Appl. No.: 15/812,243

(22) Filed: Nov. 14, 2017

(65) Prior Publication Data
US 2018/0339493 A1 Nov. 29, 2018

(30) Foreign Application Priority Data

May 24, 2017 (TW) .................................. 106117171

(51) Int. Cl.
*B32B 15/08* (2006.01)
*C08J 5/04* (2006.01)
(Continued)

(52) U.S. Cl.
CPC .............. *B32B 15/08* (2013.01); *B32B 37/06* (2013.01); *B32B 37/14* (2013.01); *C08J 5/043* (2013.01);
(Continued)

(58) Field of Classification Search
CPC ......... B32B 15/08; B32B 37/06; B32B 37/14; B32B 37/18; B32B 38/08;
(Continued)

(56) References Cited

U.S. PATENT DOCUMENTS 4,869,956 A * 9/1989 Bridges ................... B32B 15/08
428/336
6,500,529 B1 12/2002 McCarthy et al.
(Continued)

FOREIGN PATENT DOCUMENTS

| CN | 101277816 B | 8/2012 |
|---|---|---|
| EP | 0313961 A2 | 5/1989 |
| JP | H02261830 A | 10/1990 |

OTHER PUBLICATIONS

Shenzhen Core-Tex Composite Materials Co., Ltd "Manufacturing, application and development of PTFE/Teflon coated fiber glass fabric".*
(Continued)

*Primary Examiner* — Robert S Walters, Jr.
(74) *Attorney, Agent, or Firm* — Michael W. Ferrell; Ferrells, PLLC; Anna L. Kinney

(57) ABSTRACT

A method of manufacturing a metal-clad laminate and uses of the same are provided. The method comprises the following steps:
(a) impregnating a reinforcement material with a first fluoropolymer solution, and drying the impregnated reinforcement material under a first temperature to obtain a first prepreg;
(b) impregnating the first prepreg with a second fluoropolymer solution, and drying the impregnated first prepreg under a second temperature to obtain a second prepreg; and
(c) laminating the second prepreg and a metal-clad to obtain a metal-clad laminate,
wherein the first fluoropolymer solution has a first fluoropolymer, the second fluoropolymer solution has a second fluoropolymer, and the first fluoropolymer and the second fluoropolymer are different.

16 Claims, 1 Drawing Sheet

(51) Int. Cl.
*C08J 5/12* (2006.01)
*B32B 37/14* (2006.01)
*H05K 3/38* (2006.01)
*H05K 1/03* (2006.01)
*B32B 37/06* (2006.01)
*H05K 3/02* (2006.01)
*C08J 5/24* (2006.01)
*B32B 37/00* (2006.01)
*B32B 38/08* (2006.01)
*B32B 37/18* (2006.01)

(52) U.S. Cl.
CPC ............... *C08J 5/124* (2013.01); *C08J 5/244* (2021.05); *H05K 1/0353* (2013.01); *H05K 1/0366* (2013.01); *H05K 3/022* (2013.01); *H05K 3/381* (2013.01); *B32B 37/18* (2013.01); *B32B 38/08* (2013.01); *B32B 2037/0092* (2013.01); *B32B 2305/076* (2013.01); *B32B 2309/68* (2013.01); *B32B 2311/00* (2013.01); *B32B 2457/08* (2013.01); *C08J 2327/18* (2013.01); *C08J 2427/18* (2013.01); *C08J 2429/10* (2013.01); *H05K 2201/015* (2013.01)

(58) Field of Classification Search
CPC ...... B32B 2037/0092; B32B 2305/076; B32B 2309/68; B32B 2311/00; B32B 2457/08; C08J 5/043; C08J 5/124; C08J 5/24; C08J 2327/18; C08J 2427/18; C08J 2429/10; H05K 1/0353; H05K 1/0366; H05K 3/022; H05K 3/381; H05K 2201/015

See application file for complete search history.

(56) References Cited

U.S. PATENT DOCUMENTS

| | | | |
|---|---|---|---|
| 6,783,841 B2 † | 8/2004 | McCarthy | |
| 2005/0121226 A1* | 6/2005 | McKee | H05K 1/036 174/259 |
| 2010/0000771 A1 | 1/2010 | Shimauchi et al. | |

OTHER PUBLICATIONS

Chinese Office Action dated Jan. 16, 2020 in Chinese counterpart application.

\* cited by examiner
† cited by third party

METHOD OF MANUFACTURING METAL-CLAD LAMINATE AND USES OF THE SAME

CLAIM FOR PRIORITY

This application claims the benefit of Taiwan Patent Application No. 106117171 filed on May 24, 2017, the subject matters of which are incorporated herein in their entirety by reference.

BACKGROUND OF THE INVENTION

Field of the Invention

The present invention provides a manufacturing method of a metal-clad laminate and uses of the same. Especially, a manufacturing method of a fluoropolymer metal-clad laminate as well as a fluoropolymer metal-clad laminate and a printed circuit board prepared by the method are provided. The fluoropolymer metal-clad laminate prepared by the method of the present invention can be used as a circuit board that is suitable for high-frequency technical fields, such as radio frequency (RF) technical field, microwave technical field, antenna technical field and radar technical field.

Descriptions of the Related Art

There are strict requirements on the physicochemical properties of electronic materials because electronic products need to be miniature, lightweight and dense. Conventional electronic material made from an epoxy resin are failing to keep up with the trends of high-frequency and high-speed signal transmission, miniaturization of electronic elements, and high-density wiring of circuit boards. Recently, the study of electronic material focuses on the electronic material made from a fluoropolymer such as polytetrafluoroethylene (PTFE). Such electronic material includes a dielectric layer made of the fluoropolymer. Generally, electronic materials that have a dielectric layer made of the fluoropolymer have excellent electrical properties, including low dielectric constant (Dk) and low dissipation factor (DO, and good acid/alkali chemical resistance, water absorption and flame retardance. However, electronic materials including a dielectric layer made of the fluoropolymer, e.g., a metal-clad laminate, have poor metal peeling strength because the bonding strength between the fluoropolymer and the metal foil of the laminate is weak. Furthermore, when a low profile metal foil is used in such a metal-clad laminate out of consideration for electrical properties (e.g., a lower dielectric loss), the bonding strength between the metal foil and the fluoropolymer is even weaker because the metal foil has lower surface roughness.

In the prior art, to solve the aforementioned problem, an epoxy resin-based adhesive is usually used to increase the bonding strength between a metal foil and a dielectric layer (i.e., a fluoropolymer layer). However, the epoxy resin-based adhesive has poor dielectric properties and thus deteriorates the electrical properties of the resultant electronic material.

CN 101277816 B discloses a method of preparing a copper-clad laminate by using a fluoropolymer adhesive layer. As shown in FIG. 1 of the appended drawings, the method includes providing a composite film of liquid crystal polymer (LCP) and polyfluoroalkoxy (PFA) as an adhesive layer 12, aligning and attaching the adhesive layer 12 to a PTFE sheet 11 as a dielectric layer, and laminating a copper foil 13 with the adhesive layer 12 and the PTFE sheet 11 to form a fluoropolymer copper-clad laminate 1, such that the peeling strength of the copper-clad laminate can be improved by the adhesive layer 12. Note that the stacking structure of the copper-clad laminate in FIG. 1 is drawn in a separated manner to independently and clearly show every element.

However, the aforementioned method has at least the following problems in practical use. First, the method involves the use of an adhesive layer, which requires accurate aligning and attaching steps, and a deviation in the alignment will result in scrapped product. Second, an adhesive layer is usually provided along with a release film in roll type, which is costly and inconvenient because static electricity will be generated when the adhesive layer is separated from the release film and the generated static electricity makes the attachment of the adhesive layer difficult. Moreover, the accumulation of static electricity increases potential risks. In addition, the attachment of a PFA-containing adhesive layer must be carried out at a temperature which is not lower than 370° C. and therefore, is energy-consuming. Given the above, the method involving the use of a fluoropolymer adhesive layer has many disadvantages, including a more complicated process, low yields, high process difficulty and high costs. A solution for the poor bonding strength between a fluoropolymer dielectric layer and metal foil is still in demand.

SUMMARY OF THE INVENTION

In view of the aforementioned technical problems, the present invention provides a manufacturing method of a fluoropolymer metal-clad laminate. The manufacturing method of the present invention does not use any additional fluoropolymer film as an adhesive layer or involve any attaching step. In addition, the manufacturing method of the present invention can be performed at a lower temperature and thus, can be performed with a conventional treater that is equipped with an oven having a lower operable temperature (e.g., an operable temperature lower than 340° C.).

An objective of the present invention is to provide a manufacturing method of a metal-clad laminate, comprising the following steps:
  (a) impregnating a reinforcement material with a first fluoropolymer solution, and drying the impregnated reinforcement material at a first temperature to obtain a first prepreg;
  (b) impregnating the first prepreg with a second fluoropolymer solution, and drying the impregnated first prepreg at a second temperature to obtain a second prepreg; and
  (c) laminating the second prepreg and a metal foil to obtain a metal-clad laminate,
    wherein the first fluoropolymer solution has a first fluoropolymer, the second fluoropolymer solution has a second fluoropolymer, and the first fluoropolymer and the second fluoropolymer are different.

Another objective of the present invention is to provide a metal-clad laminate, which is prepared by the aforementioned manufacturing method.

Yet another objective of the present invention is to provide a printed circuit board, which is prepared from the aforementioned metal-clad laminate.

To render the above objectives, the technical features and advantages of the present invention more apparent, the present invention will be described in detail with reference to some embodiments hereinafter.

DESCRIPTION OF THE PREFERRED EMBODIMENT

Figure 1:
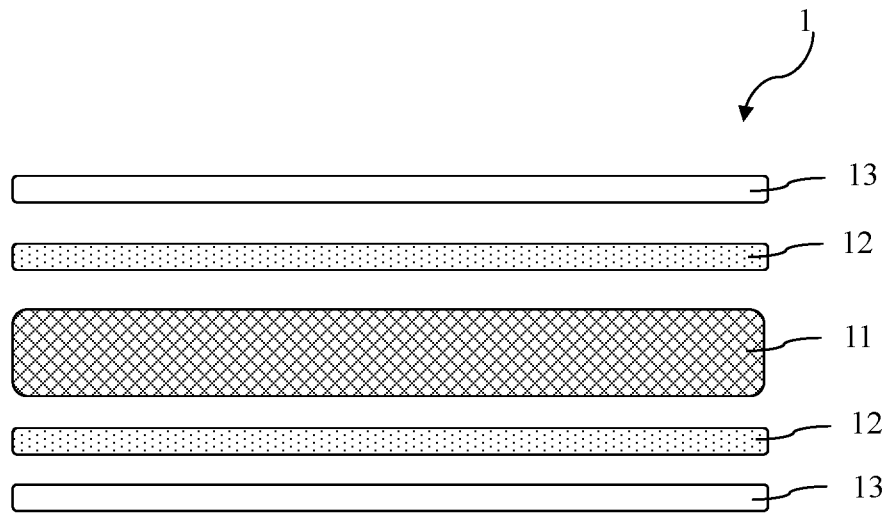
FIG. 1 is a schematic diagram showing the stacking structure of a conventional metal-clad laminate.

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion. Unless it is additionally explained, the expressions "a," "the," or the like recited in the specification (especially in the claims) should include both the singular and the plural forms. Furthermore, unless it is additionally explained, while describing the constituents in the solution, mixture and composition in the specification, the amount of each constituent is calculated based on the dry weight, i.e., regardless of the weight of the solvent. Furthermore, while mentioning an "impregnating" operation, the operation can be a dipping, coating, or spraying operation, or any operation that is capable of providing a substantially identical function. In other words, persons with ordinary skill in the art which the present invention belongs to may select different impregnating operations, such as dipping, coating, or spraying, depending on the need; and those operations shall all be included within the scope of protection of the present invention.

The present invention provides a manufacturing method of a metal-clad laminate. The technical means of the present invention includes performing a first impregnating step and a first drying step and afterwards, a second impregnating step and a second drying step. Different fluoropolymer solutions in the first impregnating step and the second impregnating step are used. The fluoropolymer metal-clad laminate manufactured by the method of the present invention is provided with excellent peeling strength and electrical properties. The manufacturing method of the present invention does not use an adhesive film to attach metal foil and therefore does not have the cost and yield problems derived from the aligning and attaching steps. Furthermore, the manufacturing method of the present invention can be performed at a lower temperature (e.g., a temperature lower than about 300° C.) to prepare the dielectric layer of electronic material and therefore, is suitable for a conventional treater. Detailed descriptions for the present invention are provided below.

The manufacturing method of a metal-clad laminate according to the present invention comprises the following steps:

(a) impregnating a reinforcement material with a first fluoropolymer solution, and drying the impregnated reinforcement material at a first temperature to obtain a first prepreg;

(b) impregnating the first prepreg with a second fluoropolymer solution, and drying the impregnated first prepreg at a second temperature to obtain a second prepreg; and (c) laminating the second prepreg and a metal foil to obtain a metal-clad laminate, wherein the first fluoropolymer solution has a first fluoropolymer, the second fluoropolymer solution has a second fluoropolymer, and the first fluoropolymer and the second fluoropolymer are different.

As used herein, the "first fluoropolymer" or "second fluoropolymer" refers to a homopolymer or a copolymer containing fluorine atoms and especially to a fluorocarbon-based polymer with multiple strong carbon-fluorine bonds. Generally, a fluoropolymer has good solvent resistance, acid resistance, and alkali resistance, and has excellent stability because of the strong carbon-fluorine bonds. In addition, a fluoropolymer has excellent dielectric properties and a wide operating temperature range and thus, is useful in many industries, such as electronic, chemical and mechanical manufacture.

Specifically, the fluoropolymer may be a polymer of the monomer selected from the following group or a copolymer of the monomer selected from the following group and other co-monomer(s): tetrafluoroethylene, chlorotrifluoroethylene, vinylidene fluoride, fluoroethylene, perfluoroether, and tetrafluoroethylene-perfluoropropylene vinyl ether. Examples of the co-monomer include but are not limited to perfluoro methyl vinyl ether, perfluoro propylene vinyl ether, hexafluoropropylene, perfluorobutyl ethylene, ethylene, propylene, and butylene. Specific examples of the fluoropolymer include but are not limited to PTFE, PFA, fluorinated ethylene propylene (FEP), polyvinylidene fluoride (PVDF), polyfluoroethylene, polychloro trifluoroethylene (PCTFE), perfluoropolyether (PFPE), ethylene-tetrafluoroethylene (ETFE), and ethylene-chloro trifluoroethylene (ECTFE).

According to the method of the present invention, the first fluoropolymer is different from the second fluoropolymer. The first fluoropolymer is the main component of the dielectric layer of a laminate, while the second fluoropolymer is to facilitate the manufacture of a metal-clad laminate. For example, in some embodiments of the present invention, the melting temperature of the second fluoropolymer is lower than the melting temperature of the first fluoropolymer. Specifically, the melting temperature of the first fluoropolymer may range from about 325° C. to about 340° C., and the melting temperature of the second fluoropolymer may range from about 250° C. to about 320° C. In the case that the melting temperature of the second fluoropolymer is lower than the melting temperature of the first fluoropolymer, the second fluoropolymer is superior to the first fluoropolymer in rheology (e.g., resin flow property) during hot-pressing and thus, improves the bonding strength between the dielectric layer and metal foil of the metal-clad laminate. In some embodiments of the present invention, the first fluoropolymer is PTFE, while the second fluoropolymer is FEP, PFA, or a combination thereof.

As used herein, the "reinforcement material" refers to a fabric reinforcement material composed of fiber material, including a woven fabric and non-woven fabric. The fiber material preferably has a high thermal stability. Examples of such fiber material include but are not limited to E-glass fiber, NE-glass fiber, S-glass fiber, L-glass fiber, D-glass fiber, quartz glass, Kevlar fiber, PTFE fiber, aromatic polyester fiber, and liquid crystal polymer (LCP) fiber. In some embodiments of the present invention, the reinforcement material is an E-glass fiber fabric composed of E-glass fiber.

As used herein, the "metal foil" refers to a thin sheet of a metal or alloy material with good electrical conductivity. The preparing method of the metal foil is not particularly limited. For example, the metal foil can be formed by mechanical processing or chemical processing such as rolled-annealed (RA) or electro-deposited (ED). Examples of the aforementioned metal or alloy material include but are not limited to stainless steel, copper, aluminum, zinc, iron, nickel, gold, silver, transition metals, and alloy materials of two or more of the aforementioned metal. The surface of the metal foil may be roughened, unroughened, or slightly roughened. The surface roughness (Ra) of roughened metal foil may range from about 5 μm to about 10 μm, and the surface roughness (Ra) of unroughened or slightly roughened metal foil may range from about 0.1 μm to about 5 μm. The aforementioned surface roughness (Ra) of the metal foil is measured according to IPC-4562 and IPC-TM-650. The surface roughness is usually determined by a contact-type profilometer or optical-type profilometer such as a Wyko optical-type profilometer available from Veeco Company. In the case of copper foil, copper foil can be classified into the following types in accordance with its surface roughness (Ra): high temperature elongation (HTE) type copper foil (Ra: 6 μm to 10 μm), reversed treated foil (RTF) type copper foil (Ra: 2 μm to 5 μm), very low profile (VLP) or very small profile (VSP) type copper foil (Ra: <2 μm), and hyper very low profile (HVLP) type copper foil (Ra: <1.5 μm). High surface roughness can improve the bonding strength between the metal foil and fluoropolymer dielectric layer of the metal-clad laminate but will adversely affect the electrical properties of the metal-clad laminate at high frequency. Therefore, in some embodiments of the present invention, low profile metal foil with surface roughness less than about 5 μm is used.

According to the method of the present invention, to obtain a dielectric layer with the desired thickness, the impregnating operation of the first fluoropolymer solution and the corresponding drying operation in step (a) may be repeated in the same order several times to provide a dielectric layer with sufficient thickness. For example, the impregnating operation and the corresponding drying operation in step (a) can be performed in the same order two times, three times, four times, or five times. Similarly, if necessary, the impregnating operation of the second fluoropolymer solution and the corresponding drying operation in step (b) may be repeated in the same order several times. For example, to improve the bonding strength between the dielectric layer and metal foil of the metal-clad laminate (i.e., the peeling strength of the metal-clad laminate), the impregnating operation and the corresponding drying operation in step (b) can be performed in the same order two times, three times, four times, or five times.

In the manufacturing method of the present invention, the step of forming the dielectric layer of metal-clad laminate includes step (a) and step (b). In step (a), the reinforcement material impregnated with the first fluoropolymer solution is dried at the first temperature to remove solvent and thus, form the first prepreg. The first temperature may be about 300° C. or a lower temperature, such as about 200° C., about 210° C., about 220° C., about 230° C., about 240° C., about 250° C., about 260° C., about 270° C., about 280° C., or about 290° C. In step (b), the first prepreg is further impregnated with the second fluoropolymer solution, and dried at the second temperature to form the second prepreg. The second temperature may also be 300° C. or a lower temperature, such as about 200° C., about 210° C., about 220° C., about 230° C., about 240° C., about 250° C., about 260° C., about 270° C., about 280° C., or about 290° C. The second prepreg is then subjected to a laminating operation together with metal foil to obtain a metal-clad laminate.

Therefore, one of the advantages of the method according to the present invention is that the dielectric layer of electronic material can be prepared at a lower process temperature (e.g., about 300° C. or lower temperature) without a further high temperature ripening step (e.g., a ripening step at 340° C. or higher temperature). Thus, the method of the present invention is suitable for a conventional treater with an oven with an operable temperature not higher than 340° C. and can be applied more widely.

In the manufacturing method of the present invention, step (c) is the laminating operation of the second prepreg and metal foil. The laminating operation is not particularly limited and may be performed by any laminating procedures generally used in the technical field of laminate or printed circuit board. In some embodiments of the present invention, a high temperature laminating machine, e.g., a vacuum high temperature laminating machine, is employed and the hot-pressing conditions are as follows: the hot-pressing temperature ranges from about 360° C. to about 390° C., the hot-pressing pressure ranges from about 3 MPa to about 60 MPa, and the hot-pressing period ranges from about 30 minutes to about 360 minutes. However, the present invention is not limited to the aforementioned conditions and machine.

The first fluoropolymer solution and the second fluoropolymer solution may each further comprise other optional components, such as a filler, a dispersing agent, a toughener, and a viscosity modifier, to improve the physicochemical properties of the resultant metal-clad laminate or the processability of each fluoropolymer solution during the manufacture of the metal-clad laminate. For example, the first fluoropolymer solution and the second fluoropolymer solution may each further comprises a filler selected from the group consisting of silica, aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzs, diamonds, diamond-like carbon, graphites, calcined kaolin, pryan, micas, hydrotalcite, hollow silica, PTFE powders, glass beads, hollow glass beads, ceramic whiskers, carbon nanotubes, nanosized inorganic powders, and combinations thereof.

The first fluoropolymer solution is prepared by dissolving or dispersing the first fluoropolymer and other optional components into a suitable solvent; and similarly, the second fluoropolymer solution is prepared by dissolving or dispersing the second fluoropolymer and other optional components into a suitable solvent. The solvent here can be any inert solvent which can dissolve or disperse but does not react with the first fluoropolymer, the second fluoropolymer, and other optional components. Examples of the solvent include but are not limited to water, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methyl-pyrolidone (NMP), dimethyl sulfoxide (DMSO), tetrahydrofuran (THF), diethyl carbonate, propylene carbonate, and hexamethylphosphoramide (HMPA). The listed solvents can either be used alone or in combination. The amount of the solvent is not particularly limited as long as the first fluoropolymer, the second fluoropolymer, and other optional components can be evenly dissolved or dispersed therein.

Figure 2:
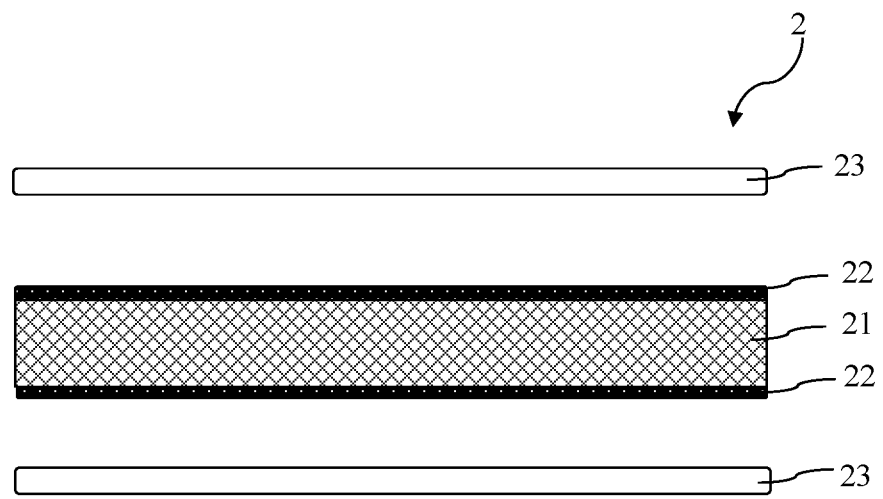
FIG. 2 is a schematic diagram showing the stacking structure of an embodiment of a metal-clad laminate prepared by the manufacturing method of the present invention.

The present invention also provides a metal-clad laminate prepared by the aforementioned manufacturing method of a metal-clad laminate. FIG. 2 is a schematic diagram showing the stacking structure of an embodiment of metal-clad laminate prepared by the manufacturing method of the present invention. Note that the stacking structure of the metal-clad laminate in FIG. 2 is drawn in a separated manner to independently and clearly show every element. In the embodiment of FIG. 2, the metal-clad laminate 2 is manufactured with PTFE as the first fluoropolymer and PFA as the second fluoropolymer and by the following process. A glass-fiber fabric (i.e., reinforcement material) is impregnated with a PTFE dispersing emulsion (i.e., the first fluoropolymer solution) and then baked at a temperature from about 100° C. to about 300° C. to obtain a PTFE sheet 21 (i.e., the first prepreg). Next, the PTFE sheet 21 is impregnated with a PFA dispersing emulsion (i.e., the second fluoropolymer solution) and then baked at about 100° C. to about 300° C. to obtain a PTFE sheet 21 coated with a PFA layer 22 (i.e., second prepreg). Afterwards, the PTFE sheet 21 coated with the PFA layer 22 is hot-pressed with metal foil 23 to obtain the metal-clad laminate 2.

The present invention also provides a printed circuit board prepared from the aforementioned metal-clad laminate, wherein the printed circuit board is prepared by patterning one side or two sides of the surface of the external metal foil of the metal-clad laminate.

The present invention will be further illustrated by the embodiments hereinafter, wherein the measuring instruments and methods are respectively as follows:

[Peeling Strength]

The peeling strength refers to the bonding strength between the metal foil and laminated prepreg, which is expressed by the force required for vertically peeling the clad copper foil with a width of ⅛ inch from the surface of the laminated prepreg.

[Dielectric Constant (Dk) and Dissipation Factor (Df) Measurement]

Dk and Df of the metal-clad laminate are measured according to ASTM D150 under an operating frequency of 10 GHz.

EXAMPLES

[Preparation of Copper-Clad Laminate]

Example 1

As shown in Table 1, an E-glass fiber fabric (1080 type) was impregnated with a PTFE dispersing emulsion (trade name: DISP 30, available from DuPont, PTFE solid content is 60 wt %), and the impregnated E-glass fiber fabric was then baked at a low temperature of 250° C. to dry the PTFE dispersing emulsion. The above impregnating and drying steps were repeated such that the E-glass fiber fabric was impregnated with the PTFE dispersing emulsion twice to obtain a PTFE sheet. Next, the PTFE sheet was impregnated with a PFA dispersing emulsion (trade name: PFA355D, available from DuPont, PFA solid content is 60 wt %) and then baked at 200° C. to dry the PFA dispersing emulsion. The above impregnating and drying steps were repeated such that the PTFE sheet was impregnated twice and a PFA-coated PTFE sheet was obtained. Afterwards, two sheets of HTE type copper foil (0.5 oz., trade name: PLS, available from CCP) were respectively superimposed on both of the two outer surfaces of the PFA-coated PTFE sheet to provide a superimposed object. A hot-pressing operation was performed on the superimposed object to provide a copper-clad laminate 1. Herein, the hot-pressing conditions are as follows: using a vacuum high temperature laminating machine and hot-pressing at 360° C. and 3 MPa for 90 minutes.

Example 2

The preparation procedures of Example 1 were repeated to prepare a copper-clad laminate 2, except that the impregnated E-glass fiber fabric was baked at a high temperature of 370° C. to dry the PTFE dispersing emulsion, as shown in Table 1.

Example 3

The preparation procedures of Example 1 were repeated to prepare a copper-clad laminate 3, except that the PTFE sheet was impregnated with the PFA dispersing emulsion once, as shown in Table 1.

Example 4

The preparation procedures of Example 3 were repeated to prepare a copper-clad laminate 4, except that the impregnated E-glass fiber fabric was baked at a high temperature of 370° C. to dry the PTFE dispersing emulsion, as shown in Table 1.

Example 5

The preparation procedures of Example 1 were repeated to prepare a copper-clad laminate 5, except that the HTE type copper foil was replaced with VLP (very low profile) type copper foil (0.5 oz., trade name: T9FZ, available from Fukuda), as shown in Table 1.

Example 6

The preparation procedures of Example 5 were repeated to prepare a copper-clad laminate 6, except that the impregnated E-glass fiber fabric was baked at a high temperature of 370° C. to dry the PTFE dispersing emulsion, as shown in Table 1.

Comparative Example 1

As shown in Table 1, an E-glass fiber fabric (1080 type) was impregnated with PTFE dispersing emulsion (trade name: DISP 30), and the impregnated E-glass fiber fabric was then baked at a high temperature of 370° C. to dry the PTFE dispersing emulsion. The above impregnating and drying steps were repeated such that the E-glass fiber fabric was impregnated with the PTFE dispersing emulsion twice to obtain a PTFE sheet. Next, two sheets of PFA film (trade name: CHEMFILM, available from Saint Gobain) as adhesive layers were respectively superimposed on both of the two outer surfaces of the PTFE sheet, and an alignment procedure of PFA film was performed. Afterwards, two sheets of HTE type copper foil (0.5 oz., trade name: PLS) were respectively superimposed on both of the two outer surfaces of the PFA film-covered PTFE sheet to provide a superimposed object. A hot-pressing operation was performed on the superimposed object to provide a comparative copper-clad laminate 1. Herein, the hot-pressing conditions are as follows: using a vacuum high temperature laminating machine and hot-pressing at 360° C. and 3 MPa for 90 minutes.

TABLE 1

Preparation of copper-clad laminates

| | Example 1 | Example 2 | Example 3 | Example 4 | Example 5 | Example 6 | Comparative example 1 |
|---|---|---|---|---|---|---|---|
| Glass-fiber fabric | E-glass 1080 | E-glass 1080 | E-glass 1080 | E-glass 1080 | E-glass 1080 | E-glass 1080 | E-glass 1080 |
| Copper foil type | HTE | HTE | HTE | HTE | VLP | VLP | HTE |
| Drying temperature of PTFE dispersing emulsion | 250° C. | 370° C. | 250° C. | 370° C. | 250° C. | 370° C. | 370° C. |
| PFA film | None | None | None | None | None | None | Upper/lower PFA film |
| Impregnation times of PFA dispersing emulsion | Twice | Twice | Once | Once | Twice | Twice | None |
| Drying temperature of PFA dispersing emulsion | 200° C. | 200° C. | 200° C. | 200° C. | 200° C. | 200° C. | None |

The peeling strength, dissipation factor (Df), and dielectric constant (Dk) of copper-clad laminates 1 to 6 (resin content (RC): 85%) and comparative copper-clad laminate 1 (resin content (RC): 85%) were measured. The results are tabulated in Table 2.

TABLE 2

Properties of copper-clad laminates

| | Peeling strength (unit: pounds/inch) | Dk @ 10 GHz | Df @ 10 GHz |
|---|---|---|---|
| Copper-clad laminate 1 | 7.41 | 2.480 | 0.002044 |
| Copper-clad laminate 2 | 6.89 | 2.523 | 0.002151 |
| Copper-clad laminate 3 | 5.64 | 2.531 | 0.002120 |
| Copper-clad laminate 4 | 5.87 | 2.580 | 0.002380 |
| Copper-clad laminate 5 | 6.48 | 2.491 | 0.002210 |
| Copper-clad laminate 6 | 6.53 | 2.487 | 0.002370 |
| Comparative copper-clad laminate 1 | 6.82 | 2.525 | 0.002057 |

As shown in Table 2, the electrical properties of copper-clad laminates 1 to 6 prepared by the method of the present invention are comparable to those of the copper-clad laminate prepared by the conventional method which applies a PFA film as an adhesive layer (i.e., comparative copper-clad laminate 1). Furthermore, in the case where the E-glass fiber fabric was impregnated with the PFA dispersing emulsion once, the prepared copper-clad laminates (i.e., copper-clad laminates 3 and 4) already have acceptable peeling strength, and in the case where the E-glass fiber fabric was impregnated with the PFA dispersing emulsion twice, the prepared copper-clad laminates have an outstanding peeling strength that is superior to the copper-clad laminates prepared by the conventional method (see the comparison between copper-clad laminates 1 and 2 and comparative copper-clad laminate 1). In addition, even in the case where the low profile copper foil is used, the copper-clad laminates prepared by the method of the present invention (i.e., copper-clad laminates 5 and 6) still have excellent peeling strength. The above results show that the method of the present invention can provide a metal-clad laminate with excellent electrical properties and peeling strength without performing an additional adhesive layer attaching step.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF NUMERAL REFERENCES

1: copper-clad laminate
2: metal-clad laminate
11, 21: PTFE sheet
12: adhesive layer
13: copper foil
22: PFA layer
23: metal foil

What is claimed is:

1. A manufacturing method of a metal-clad laminate, comprising the following steps:
   (a) impregnating a reinforcement material with a first fluoropolymer solution, and drying the impregnated reinforcement material at a first temperature to obtain a first prepreg;
   (b) impregnating the first prepreg with a second fluoropolymer solution, and drying the impregnated first prepreg at a second temperature to obtain a second prepreg; and
   (c) laminating the second prepreg and a metal foil to obtain a metal-clad laminate,
   wherein the first fluoropolymer solution has a first fluoropolymer, the second fluoropolymer solution has a second fluoropolymer, and the first fluoropolymer and the second fluoropolymer are different,
   wherein the method does not use an epoxy resin and does not use an adhesive film to attach the metal foil, and
   wherein the first prepreg and the second prepreg are prepared at a process temperature not higher than 300° C.

2. The manufacturing method of claim 1, wherein in step (a), the impregnating and drying are repeated in the same order at least one more time.

3. The manufacturing method of claim 1, wherein in step (b), the impregnating and drying are repeated in the same order at least one more time.

4. The manufacturing method of claim 1, wherein the metal foil is a low profile metal foil.

5. The manufacturing method of claim 1, wherein the melting temperature of the second fluoropolymer is lower than the melting temperature of the first fluoropolymer.

6. The manufacturing method of claim 5, wherein in step (a), the impregnating and drying are repeated in the same order at least one more time.

7. The manufacturing method of claim 5, wherein in step (b), the impregnating and drying are repeated in the same order at least one more time.

8. The manufacturing method of claim 5, wherein the metal foil is a low profile metal foil.

9. The manufacturing method of claim 1, wherein the first fluoropolymer is polytetrafluoroethylene (PTFE).

10. The manufacturing method of claim 9, wherein in step (a), the impregnating and drying are repeated in the same order at least one more time.

11. The manufacturing method of claim 9, wherein in step (b), the impregnating and drying are repeated in the same order at least one more time.

12. The manufacturing method of claim 9, wherein the metal foil is a low profile metal foil.

13. The manufacturing method of claim 1, wherein the second fluoropolymer is selected from the group consisting of fluorinated ethylene propylene (FEP), polyfluoroalkoxy (PFA), and combinations thereof.

14. The manufacturing method of claim 13, wherein in step (a), the impregnating and drying are repeated in the same order at least one more time.

15. The manufacturing method of claim 13, wherein in step (b), the impregnating and drying are repeated in the same order at least one more time.

16. The manufacturing method of claim 13, wherein the metal foil is a low profile metal foil.

* * * * *